United States Patent
Campini et al.

(10) Patent No.: US 7,145,774 B2
(45) Date of Patent: Dec. 5, 2006

(54) BACKSIDE COOLING APPARATUS FOR MODULAR PLATFORMS

(75) Inventors: Edoardo Campini, Mesa, AZ (US); William F. Handley, Chandler, AZ (US); Mark D. Summers, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 327 days.

(21) Appl. No.: 10/748,771

(22) Filed: Dec. 29, 2003

(65) Prior Publication Data

US 2005/0141200 A1  Jun. 30, 2005

(51) Int. Cl.
  *H05K 7/20* (2006.01)
(52) U.S. Cl. .............. 361/719; 361/704; 361/710; 361/714; 174/16.3; 165/80.3
(58) Field of Classification Search .......... 361/687, 361/695, 708–710.1, 714–717, 719–727, 361/742; 29/830, 832; 257/691, 706–721; 174/16.3, 138 G; 165/80.2, 80.3, 185
See application file for complete search history.

(56) References Cited

U.S. PATENT DOCUMENTS

| | | | | |
|---|---|---|---|---|
| 4,535,385 A | * | 8/1985 | August et al. ............. | 361/711 |
| 5,050,040 A | * | 9/1991 | Gondusky et al. .......... | 361/708 |
| 5,262,922 A | * | 11/1993 | Yamaji et al. ............. | 361/720 |
| 5,473,510 A | | 12/1995 | Dozier, II | |
| 5,838,543 A | * | 11/1998 | Nakamura et al. .......... | 361/704 |
| 5,926,371 A | * | 7/1999 | Dolbear ...................... | 361/704 |
| 5,960,535 A | * | 10/1999 | Rubens et al. ............. | 29/832 |
| 6,084,776 A | * | 7/2000 | Cuntz et al. ................ | 361/707 |
| 6,661,664 B1 | * | 12/2003 | Sarno et al. ................ | 361/719 |

FOREIGN PATENT DOCUMENTS

| JP | 04162459 | 6/1992 |
|---|---|---|
| JP | 07007109 | 1/1995 |
| JP | 2003218570 | 7/2003 |
| JP | 2003258467 | 9/2003 |

OTHER PUBLICATIONS

Advanced TCA™, PICMG® 3.0 Revision 1.0, Advanced TCA™ Base Specification, Dec. 30, 2002, pp. i-414.
Release Notes, PICMG ECN 3.0-1.0-001, Feb. 17, 2004, pp. 1-4, with AdvancedTCA®, PICMG Specification, Engineering Change Notice 3.0-1.0-001, Jan. 14, 2004, Affected Specification: PICMG 3.0 R1.0, pp. i-D-12.

* cited by examiner

*Primary Examiner*—Michael Datskovskiy
(74) *Attorney, Agent, or Firm*—Schwabe, Williamson & Wyatt, P.C.

(57) ABSTRACT

A thermal management apparatus is provided, wherein heat generated by an electronic component coupled to a backside of a carrier substrate may be transferred to an opposite front side of the carrier substrate through a thermal conductor sized to pass through an opening in the carrier substrate.

24 Claims, 2 Drawing Sheets

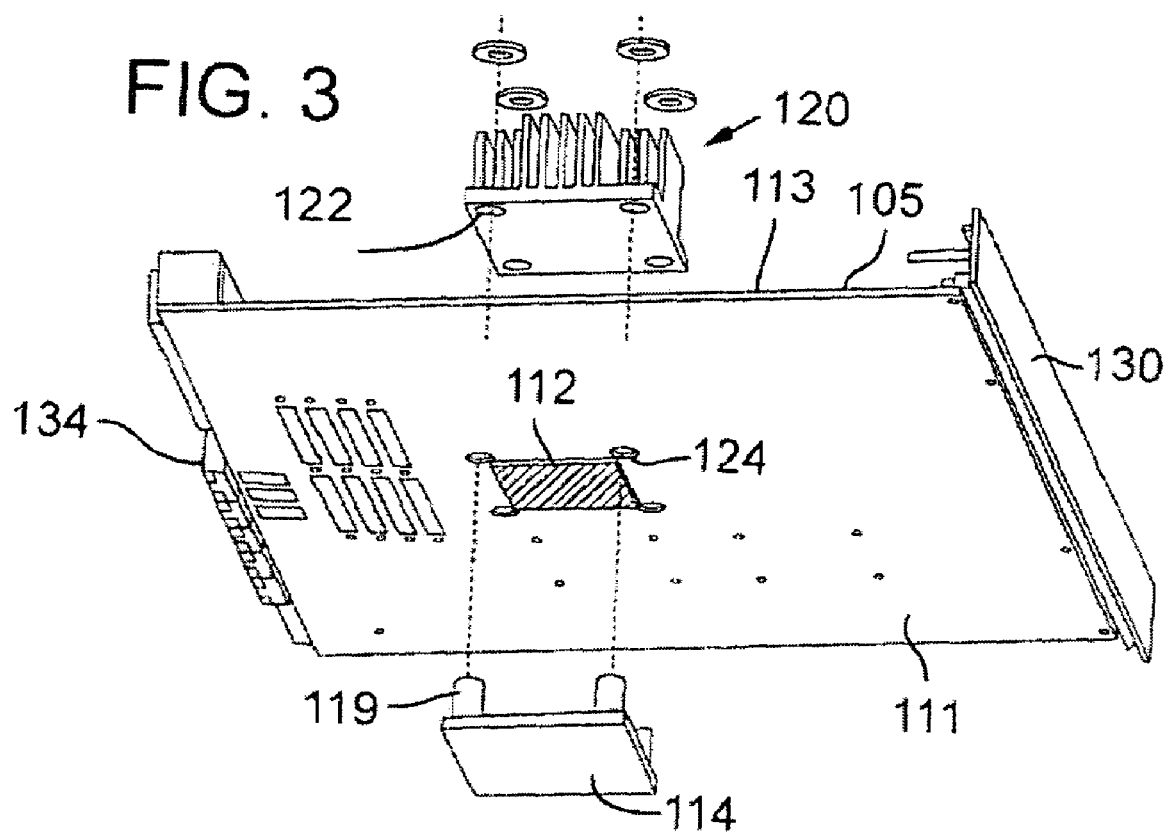

BACKSIDE COOLING APPARATUS FOR MODULAR PLATFORMS

FIELD OF THE INVENTION

Embodiments of the invention generally relate to modular computing systems, such as, systems in accordance or in compliance with the specification of the Advanced Telecom Computing Architecture (ATCA). More specifically, disclosed embodiments of the invention relate to an apparatus and method for cooling backside components on modular platform boards.

BRIEF DESCRIPTION OF THE DRAWINGS

The invention is illustrated by way of example and not by way of limitation in the figures of the accompanying drawings, in which the like references indicate similar elements and in which:

FIG. 3 illustrates an exploded view of a modular platform board in accordance with an embodiment of the present invention.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments of the present invention may provide a thermal management solution for heat generating electronic components mounted on the back side of a modular platform board (back side components), where cooling such electronic components may be hampered or restricted. Back side electronic components may include, but are not limited to, semiconductor devices, such as a microprocessor, that tend to generate significant amounts of heat.

Modular platform boards may be used in a variety of modular platform applications, including, but not limited to enterprise servers, telecommunications servers, flexi-servers and the like. One particular example where modular platform boards are being used is for Advance Telecommunications Computing Architecture (ATCA) solutions. ATCA requirements are set forth in the PCI Industrial Computer Manufacturers Group (PICMG) 3.0 ATCA Specification (ATCA Specification), which is targeted to the next generation of carrier grade communication equipment.

Figure 1:
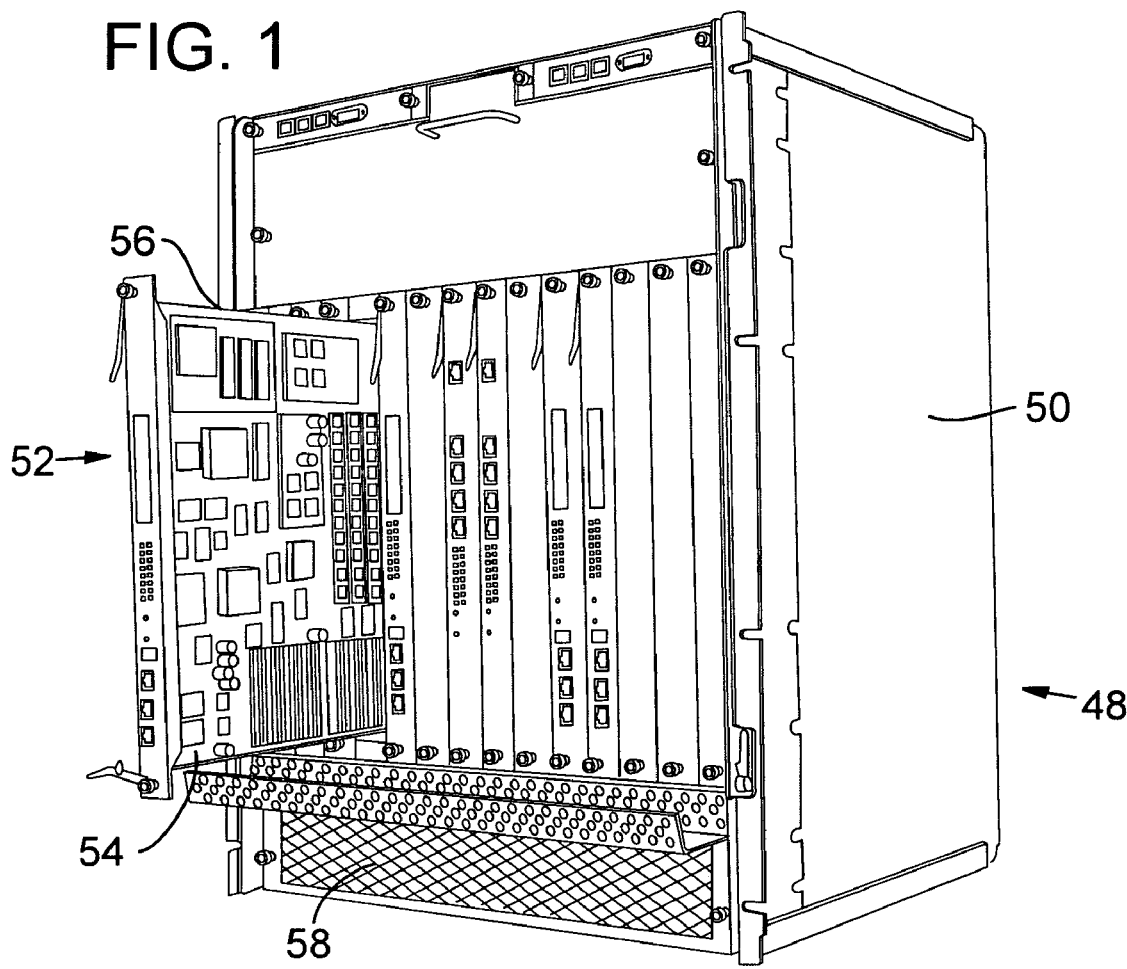
FIG. 1 Illustrates a perspective view of a modular platform in accordance with an embodiment of the present invention.

FIG. 1 illustrates a perspective view of a modular platform 48 where several high density modular platform boards 52, may be vertically positioned in a horizontal array within a shelf 50. Due in part to the vast number of electronic components, modular platform boards 52 can generate a substantial amount of heat that must be disposed of to maintain an operable environment. A cooling medium, such as air, may be pulled in through an intake 58, circulated past modular platform boards 52 and vented out a shelf exhaust (not shown) to facilitate cooling of the electronic components.

The spacing between adjacent modular platform boards 52 may often times be minimal, thus leaving little room for components on the front side 54 of the modular platform board 52, and even less on the back side 56. As a result, many specifications and design requirements restrict the overall modular platform profile height to control the aggregate thickness of electronic components mounted on the modular platform board.

For example, the ATCA specification sets forth strict stand off requirements to control the aggregate thickness on both sides of the modular platform board. For front side 54, the maximum component rise from the board, or profile is 21.33 mm. This is typically enough room for a component, such as a microprocessor, and an attached heat dissipation device, such as a heat sink. The backside 56 aggregate thickness limit, however, is 4.66 millimeters, and in some cases may be limited to 2.86 mm. Such a backside limitation is barely enough to accommodate an electronic component, much less an effective heat dissipation device.

The ATCA Specification also requires that the backside 56 of the modular platform boards 52 be covered with a non-conducting material to prevent potential shorts with the front side components of an adjacent modular platform board. This requirement is a result of the fact that the modular platform boards 52 in an ATCA shelf are hot swappable, in that the modular platform boards adjacent to the modular platform board being swapped in or out are energized. Such a covering, however, effectively eliminates any transfer of heat from a back side electronic component to the circulating cooling medium.

Due at least in part to these limitations (i.e. inter-modular platform board spacing, aggregate thickness requirements, and backside coverings) backside electronic components may not be adequately cooled by the circulating cooling medium. Accordingly, heat generating back side electronic components are typically avoided. Embodiments in accordance with the present invention provide a thermal management system for thermally transferring the heat generated by a backside component to the front side of the modular platform where the heat can be transferred to a circulating cooling medium.

Figure 2:
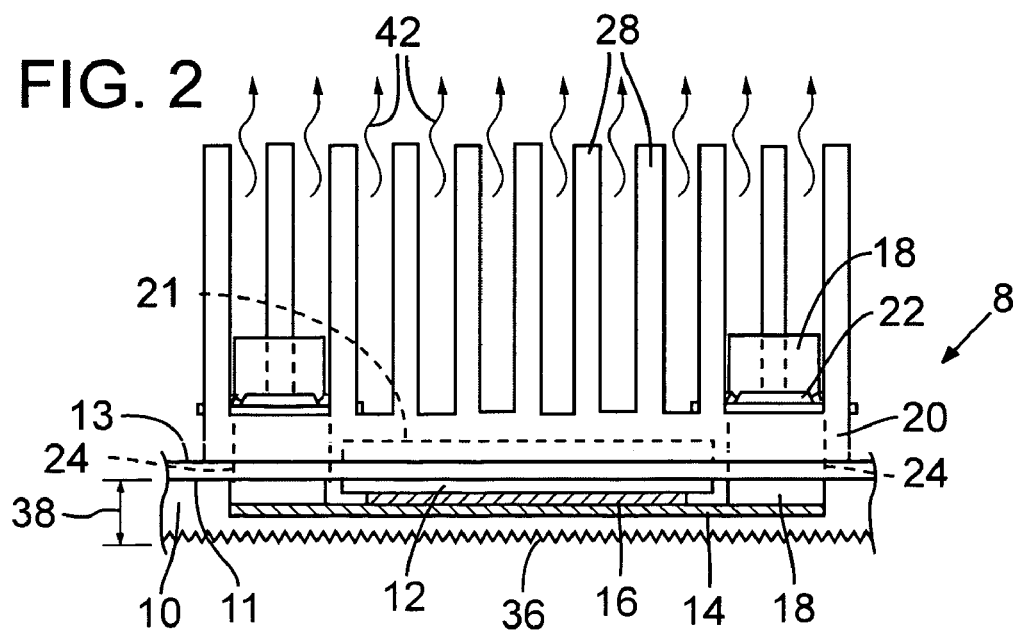
FIG. 2 illustrates a cross sectional view of a thermal cooling apparatus in accordance with an embodiment of the present invention.

FIG. 2 illustrates a cross-sectional view of a thermal management apparatus in accordance with an embodiment of the present invention. An electronic component 12 is coupled to a back side 11 of a modular platform board 10. Modular platform board 10 may include, but is not limited to, any carrier substrate, such as a printed circuit board (PCB) or other substrate form factor that may allow components to electrically interconnect and accommodate signal and power routing. Covering 36 may be positioned over backside 11. Heat generated by electronic component 12 is affirmatively managed, to avoid over heat and malfunction, which may ultimately cause the modular platform board to fail.

A first thermal management apparatus 8 may transfer heat generated from the electronic component 12 to the front side 13 of board 10, where the heat can be transferred to the circulating cooling medium as shown by 42. A low profile heat dissipation device 14 may be coupled to the backside heat dissipation device 14 may include, but is not limited to a heat sink, heat spreader, or other such devices. Though not required, thermal interface material (TIM) 16 may also be disposed between heat dissipation device 14 and backside component 12 to help ensure effective heat transfer.

To accommodate aggregate thickness limitation 38, the heat dissipation device should have a low profile such that the overall thickness of the backside component 12, TIM 16 (if used), heat dissipation device 14 and protective cover 36 is less than or equal to aggregate thickness limitation 38. For example, as set forth in the ATCA specification, the overall thickness 38 may be less than or equal to 4.66 mm.

Thermal conductors 18 may be thermally and mechanically coupled to heat dissipation device 14. Thermal conductors 18 may act to transfer heat away from the heat dissipation device 14 and electronic component 12. Thermal conductors 18 may be configured to pass through openings in modular platform board 10, so that they may transfer heat from the back side 11 to the front side 13. Once on the front side 13, the heat may be transferred to the circulating cooling medium.

Thermal conductors 18 may be constructed of a conductive material, including, but not limited to, cooper, aluminum, or various alloys. For higher capacity and transfer rates, more sophisticated heat transfer devices may be used for thermal conductors 18, including, but not limited to heat pipes and other multi phase configurations, liquid transfer mechanisms and thermoelectric devices.

Thermal conductors 18 may be independently coupled to heat dissipation device 14, or may be integrally formed as part of heat dissipation device 14. Where a liquid cooling loop is used to transfer heat from the backside 11 to the front side 13, the loop may be integrated with and circulate through the heat dissipation device 14 and thermal conductors 18.

With the heat generated from backside electronic component 12 transferred to the front side 13 of modular platform board 10, thermal conductors 18 may be thermally coupled to a front side or second heat dissipation device 20. Front side heat dissipation device 20 may be configured to efficiently transfer heat 42 from thermal conductors 18 to the cooling medium being circulated through the shelf in which the modular platform board 10 is inserted. Front side heat dissipation device 20 may have a plurality of projections 28 that create a large surface area that may enable a greater rate of heat transfer from front side heat dissipation device 20 to the cooling medium. A variety of heat dissipation devices can be used for front side heat dissipation device 20, including, but not limited to, air cooled, liquid cooled, conduction cooled, thermoelectric, and phase change type devices.

Where a plurality of thermal conductors are used, front side heat dissipation device 20 may have a corresponding number of apertures 24 positioned and dimensioned to receive corresponding thermal conductors 18. The front side heat dissipation device may be removably secured to the thermal conductors 18 using fasteners 22.

Front side heat dissipation device 20 may be coupled to the front side 13 of modular platform board 10 and in thermal communication with thermal conductors 18. Front side heat dissipation device 20 may also be configured to overlay a front side electronic component 21 that is opposably positioned on the front side 13 in relation to a back side electronic component 12. In such a configuration, front side heat dissipation device may transfer heat from both the front side component, and the back side component (via the thermal conductors) to the cooling medium circulating through the shelf.

Configuring components on opposite sides of modular platform board may increase the density of the modular platform boards and take better advantage of the aggregate thickness allowed on both sides of the modular platform board. Opposably positioning components also may shorten the routing and transmission distances between the back side and front side component, which may improve component response and performance.

By positioning electronic components on the backside of a modular platform board and thermally managing the generated heat, the logistics of routing between various components, both front and backside, and routing to various input output devices and back plain connectors may be simplified and further help maximize board space.

FIG. 3 illustrates an exploded view of a thermal management system in accordance with an embodiment of the present invention. A modular platform board 105 may have a front panel 130, a back plane interface 134 a front side 113 and a back side 111. An electronic component 112 may be coupled to back side 111. One or more openings 124 may extend through modular platform board 105 and be positioned about the periphery of electronic component 112. Corresponding one or more thermal conductors 119 may be disposed through openings 124. A low profile backside heat dissipation device 114 may be coupled to backside electronic component 112 and thermal conductors 119 to transfer heat from electronic component 112 to the front side 113.

Front side heat dissipation device 120 may be provided, and may be configured to transfer heat to the environment. Front side heat dissipation device may have a plurality of openings 122 configured to receive a corresponding thermal conductor 119. Heat may then be transferred from back side component 112 through backside heat dissipation device 114 and thermal conductors 119 to front side heat dissipation device 120, which in turn may transfer the heat to the environment.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A thermal management apparatus, comprising:
   a carrier substrate having a first side and an opposite second side and an opening extending from the first side to the second side;
   a protective cover disposed to substantially enclose the first side; and
   a thermal conductor dimensioned to fit in the opening to facilitate transfer of heat generated by a first electronic component attached to the first side for dissipation exclusively at the second side; and
   a second heat dissipation device disposed on the second side and thermally coupled to the thermal conductor to dissipate said heat transferred away from the component disposed on the first side, the second heat dissipation device is configured to thermally couple to a second electronic component disposed on the second side.

2. The thermal management apparatus of claim 1, further comprising a first heat dissipation device coupled to the first electronic component and the thermal conductor, and configured to transfer heat generated by the first electronic component to the thermal conductor.

3. The thermal management apparatus of claim 2, wherein the first heat dissipation device is one of a low profile heat sink and heat spreader.

4. The thermal management apparatus of claim 2, wherein the carrier substrate is at least part compliant with a standard and the aggregate thickness of the component and the first heat dissipation device is within a dimension requirement of the standard.

5. The thermal management apparatus of claim 4, wherein the standard is PlCMG 3.0 ATCA, and the dimension requirement is 4.66 mm.

6. The thermal management apparatus of claim 4, wherein the first side is covered with a nonconductive material and the aggregate thickness of the nonconductive material, the component, and the first heat dissipation device is less than or equal to 4.66 mm.

7. The thermal management apparatus of claim 1, wherein the thermal conductor is one selected from the group consisting of a solid core conductor, a liquid filled conductor and a heat pipe.

8. The thermal management apparatus of claim 1 wherein the second heat dissipation device is configured to transfer heat to a surrounding environment.

9. The thermal management apparatus of claim 8, wherein the second heat dissipation device is one selected from the group consisting of air cooled, liquid cooled, thermoelectric, and phase change.

10. The thermal management apparatus of claim 1, wherein the second heat dissipation device is removably coupled to the thermal conductor by a fastener and retains the first heat dissipation device against the first electronic component.

11. The thermal management apparatus of claim 1, further comprising one or more additional openings extending from the first side to the second side, and one or more additional thermal conductors dimensioned to fit in the one or more additional openings to facilitate transfer of heat generated by the first electronic component.

12. A modular platform, comprising:
  a shelf;
  a plurality of modular platform boards at least one of the boards including a thermal management apparatus, the thermal management apparatus comprising
  a carrier substrate having a first side and an opposite second side and an opening extending from the first side to the second side;
  a protective cover disposed to substantially enclose the first side;
  a thermal conductor dimensioned to fit in the opening to facilitate transfer of heat generated by a first electronic component attached to the first side for dissipation exclusively at the second side; and
  a second heat dissipation device disposed on the second side and thermally coupled to the thermal conductor to dissipate said heat transferred away from the component disposed on the first side; the second heat dissipation device is configured to thermally couple to a second electronic component disposed on the second side.

13. The modular platform of claim 12, further comprising a first heat dissipation device coupled to the first electronic component and the thermal conductor, and configured to transfer heat generated by the first electronic component to the thermal conductor.

14. The modular platform of claim 13, wherein the first heat dissipation device is one of a low profile heat sink and heat spreader.

15. The modular platform of claim 13, wherein the carrier substrate is at least part compliant with a standard and the aggregate thickness of the component and the first heat dissipation device is within a dimension requirement of the standard.

16. The modular platform of claim 15, wherein the standard is PICMG 3.0 ATCA, and the dimension requirement is 4.66 mm.

17. The modular platform of claim 15, wherein first side is covered with a nonconductive material and the aggregate thickness of the nonconductive material, the component, and the first heat dissipation device is less than or equal to 4.86 mm.

18. The modular platform of claim 12, wherein the thermal conductor is one selected from the group consisting of a solid core conductor, a liquid filled conductor and a heat pipe.

19. The modular platform of claim 12 wherein the second heat dissipation device is configured to transfer heat to a surrounding environment.

20. The modular platform of claim 19, wherein the second heat dissipation device is one selected from the group consisting of air cooled, liquid cooled, thermoelectric, and phase change.

21. The modular platform of claim 12, wherein the second heat dissipation device is removably coupled to the thermal conductor.

22. A method comprising:
  providing a carrier substrate having a first side and an opposite second side and an opening extending from the first side to the second side, and a first electronic component coupled to the first side;
  providing a thermal conductor dimensioned to fit in the opening to facilitate transfer of heat generated by a first electronic component attached to the first side for dissipation at the second side;
  substantially enclosing the first side with a protective coven; and
  transferring heat from the electronic component exclusively to the second side via the thermal conductor;
  disposing second electronic component on the second side;
  providing a second heat dissipation device thermally coupled to the second electronic component;
  coupling the second heat dissipation device to the thermal conductor on the second side;
  transferring heat from the thermal conductor to the second heat dissipation device; and
  transferring heat from the second heat dissipation device to a surrounding environment.

23. The method of claim 22, further comprising:
  providing a first heat dissipation device coupled to the first electronic component; and
  coupling the first heat dissipation device to the thermal conductor.

24. A modular platform of claim 12, further comprising one or more additional openings extending from the first side to the second side, and one or more additonal thermal conductors dimensioned to fit in the one or more additonal openings to facilitate transfer of heat generated by the first electronic component.

* * * * *

UNITED STATES PATENT AND TRADEMARK OFFICE
CERTIFICATE OF CORRECTION

PATENT NO.          : 7,145,774 B2
APPLICATION NO. : 10/748771
DATED                   : December 5, 2006
INVENTOR(S)        : Campini et al.

It is certified that error appears in the above-identified patent and that said Letters Patent is hereby corrected as shown below:

Column 3
Lines 21-22, "..., cooper, aluminum,..." should read --..., copper, aluminum,...--.

Column 5
Line 47, "...boards at least..." should read --...boards, at least...--.

Column 6
Lines 18-19, "...4.86 mm." should read --...4.66 mm.--.

Column 6
Line 42, "...coven; and..." should read --...cover; and...--.

Column 6
Line 45, "...disposing second..." should read --...disposing a second...--.

Signed and Sealed this

Seventeenth Day of March, 2009

JOHN DOLL
*Acting Director of the United States Patent and Trademark Office*